(12) United States Patent
Bailly et al.

(10) Patent No.: US 11,811,960 B2
(45) Date of Patent: Nov. 7, 2023

(54) METHOD FOR TESTING A PORTABLE ELECTRONIC DEVICE

(71) Applicant: AIRBUS HELICOPTERS, Marignane (FR)

(72) Inventors: Stephane Bailly, Cabries (FR); Anthony Herrou, Rochegude (FR); Cyrille Carle, Bandol (FR)

(73) Assignee: AIRBUS HELICOPTERS, Marignane (FR)

( * ) Notice: Subject to any disclaimer, the term of this patent is extended or adjusted under 35 U.S.C. 154(b) by 104 days.

(21) Appl. No.: 17/690,356

(22) Filed: Mar. 9, 2022

(65) Prior Publication Data

US 2022/0294887 A1     Sep. 15, 2022

(30) Foreign Application Priority Data

Mar. 10, 2021   (FR) .................................... 2102321

(51) Int. Cl.
   *H04M 1/24*   (2006.01)
   *G06T 7/194*  (2017.01)
   *G06T 7/00*   (2017.01)

(52) U.S. Cl.
   CPC ............. *H04M 1/24* (2013.01); *G06T 7/0004* (2013.01); *G06T 7/194* (2017.01)

(58) Field of Classification Search
   CPC ........ H04M 1/24; G06T 7/0004; G06T 7/194; G06F 3/1462; G06F 11/2273;
   (Continued)

(56) References Cited

U.S. PATENT DOCUMENTS

| 9,892,479 B1* | 2/2018 | Pruitt ................. G06F 11/1004 |
| 11,715,188 B1* | 8/2023 | Mody ................. G06T 7/0002 |
| | | 382/307 |

(Continued)

FOREIGN PATENT DOCUMENTS

| CN | 111492398 A | 8/2020 |
| EP | 3495775 A1 | 6/2019 |

(Continued)

OTHER PUBLICATIONS

Japanese Office Action (with English Machine Translation), dated Feb. 24, 2023, Application No. 2022-027536, 11 Pages.

(Continued)

*Primary Examiner* — Solomon G Bezuayehu
(74) *Attorney, Agent, or Firm* — BROOKS KUSHMAN P.C.

(57) ABSTRACT

A method for testing a portable electronic device. The method comprises the following steps: acquiring at least one set of parameters; storing the at least one set of parameters in a first area of a storage unit of the portable electronic device; storing the at least one set of parameters in a second area of the storage unit; generating at least a first image by means of a first processing operation; in a first displaying step, displaying the at least one first image for a predetermined time period; in a first erasing step, erasing first intermediate results corresponding to calculation steps carried out during the first processing operation; generating at least one second image by means of a second processing operation; and in a second displaying step, displaying the at least one second image for a predetermined time period.

15 Claims, 3 Drawing Sheets

(58) Field of Classification Search
CPC . G06F 11/277; G06F 11/263; G09G 2330/10; H04L 43/50
See application file for complete search history.

(56) References Cited

U.S. PATENT DOCUMENTS

| | | | | |
|---|---|---|---|---|
| 2007/0233765 | A1* | 10/2007 | Gupta | G06F 11/263 708/446 |
| 2008/0208050 | A1* | 8/2008 | Ichioka | G01S 7/5205 382/128 |
| 2009/0243893 | A1* | 10/2009 | Filliatre | H04N 19/467 345/441 |
| 2012/0188378 | A1* | 7/2012 | Hsiao | G01N 21/274 382/218 |
| 2018/0329780 | A1* | 11/2018 | Boettjer | G06F 11/187 |
| 2019/0196926 | A1* | 6/2019 | Jong | G06T 7/97 |
| 2019/0384684 | A1* | 12/2019 | Chaiken | G06F 11/2284 |
| 2020/0241987 | A1* | 7/2020 | Iacaruso | G06F 21/575 |
| 2021/0012475 | A1* | 1/2021 | Hyatt | G01N 21/8851 |

FOREIGN PATENT DOCUMENTS

| | | |
|---|---|---|
| JP | S60-95586 A | 5/1985 |
| JP | S62-24291 A | 2/1987 |
| JP | H03-92893 A | 4/1991 |
| JP | H07-249116 A | 9/1995 |
| JP | 2011-158626 A | 8/2011 |

OTHER PUBLICATIONS

French Search Report for French Application No. FR2102321, Completed by the French Patent Office, dated Nov. 25, 2021, 10 pages.

* cited by examiner

METHOD FOR TESTING A PORTABLE ELECTRONIC DEVICE

CROSS REFERENCE TO RELATED APPLICATIONS

This application claims priority to French patent application No. FR 21 02321 filed on Mar. 10, 2021, the disclosure of which is incorporated in its entirety by reference herein.

TECHNICAL FIELD

The present disclosure relates to a method for testing a portable electronic device such as a smartphone, a tablet computer or a computer. Such a portable electronic device may in particular comprise an acquisition member, a processing unit, a storage unit and a display screen.

BACKGROUND

Such a portable electronic device may also advantageously comprise an autonomous electrical energy source such as a battery or storage batteries for storing electrical energy. The electrical energy source can supply electrical energy to the processing unit, the storage unit, and the display screen.

More particularly, the disclosure relates to a testing method designed to secure the production and display of data, such as, for example, a flight manual or performance tables of an aircraft such as an aeroplane or a rotorcraft, from a conventional portable electronic device. Such a testing method can thus be implemented partly or entirely on the ground on a ground platform, partly or entirely on the ground in the aircraft during a mission preparation phase of the aircraft or indeed partly or entirely in flight during a flight phase of the aircraft.

For security reasons, it is important to display accurate information. In the event of loss of integrity, a portable electronic device may display incorrect but non-outlier information that is difficult to detect, may freeze information on a screen or may display data with a delay, which may prove to be problematic for the piloting an aircraft.

In a known manner, and as described in document EP 3 495 775, a method for testing a portable electronic device can use a receiving support for receiving and holding the portable electronic device in position relative to an aircraft instrument panel.

Furthermore, the receiving support includes a camera for filming the images displayed on the screen of the portable electronic device and then transmitting the images acquired by the camera to a control system on board the aircraft. This control system is capable of comparing the images acquired by the camera with expected images in order to identify, for example, a display error and, more particularly, a loss of integrity of the portable electronic device.

However, such a method requires the aircraft to be equipped with dedicated additional members, such as, in particular, a receiving support comprising a camera and an external control system on board the aircraft for analyzing the images acquired by the camera.

Alternative methods are also known, such as those described in documents US2019/196926A1, US2018/329780A1, US2007/0233765A1 and US2009/243893A1.

Document US2019/196926A1 describes a graphics processing unit of a GPU subsystem of a computing device operating in a first rendering mode to process graphics data in order to produce a first image. The GPU operates in a second rendering mode to process the graphics data in order to produce a second image. The computing device detects whether a fault has occurred in the GPU subsystem based at least in part on a comparison of the first image with the second image. The document in question also describes a method for testing a portable electronic device comprising a processing unit, a first storage unit and a display screen.

Document US2018/329780A1 relates to a high data integrity processing system (HDIPS) that comprises a first processing device and a triple voted processing (TVP) device in signal communication with the first processing device. The first processing device has high radiation resistance and includes a processor, a cache memory and a computer-readable medium (CRM). The CRM is coded with computer-executable instructions instructing the processor to perform a first periodic integrity check on the first processing device producing a first integrity result, which is transmitted to the TVP device. The TVP device includes firmware on which machine instructions are coded to instruct the TVP device, simultaneously with the first periodic integrity check, to perform a second integrity check producing a second integrity result, compare the first integrity result with the second integrity result, and reset the power supply to the first processing device if the first integrity result does not match the second integrity result.

Document US2007/0233765A1 relates to a system and method for test generation for system-level verification using parallel algorithms. This method generates test patterns for system-level tests by exploiting the scalability of parallel algorithms while allowing the data set to be colored and the expected results to be verified. Based on the characteristics of the tested system, an iterative parallel algorithm is selected from a plurality of possible parallel algorithms. The selected parallel algorithm is then separated into separate program instructions for execution by a plurality of processors. A serial version of the selected algorithm is executed in order to generate a set of expected results. The devised parallel version of the selected algorithm is then executed in order to generate a set of test result data that is compared to the set of expected results. If the two data sets match, the system is determined to be operating correctly.

Document US2009/243893A1 relates to the field of the dependability of operation of display systems, and more particularly that of cockpit systems on board aircraft. It describes a method for coding the pixels of a color digital image comprising critical symbols represented by critical pixels, each color pixel being coded on three digital components each comprising the same number of bits. The components of the critical pixels comprise color information and a marker, also referred to as a tag, coded on at least one bit. Furthermore, such a marker is intended to be used by functions for generating and predicting the critical symbols.

SUMMARY

An object of the present disclosure is therefore to propose an alternative method for testing a portable electronic device that helps overcome the above-mentioned limitations. One aim of such a method is, in particular, to detect the display of erroneous data that is difficult for the user to detect without using a receiving support provided with a camera or with an external control system.

The disclosure therefore relates to a method for testing a portable electronic device, the portable electronic device including an acquisition member, a processing unit including a cache memory, a first storage unit, and a display screen.

According to the disclosure, such a method is remarkable in that it comprises the following steps:

acquiring a set of parameters X including at least one parameter x via the acquisition member;

storing the set of parameters X in a first area of the first storage unit;

storing the set of parameters X in a second area of the first storage unit, the second area being separate from the first area;

generating at least one first image representative of a first set of results Y1 including at least one first result y1, the first set of results Y1 being generated by the application, by the processing unit, of a first processing operation based on the set of parameters X stored in the first area of the first storage unit;

in a first displaying step, displaying the at least one first image on the display screen for a first predetermined time period;

in a first erasing step, erasing first intermediate results corresponding to calculation steps carried out during the first processing operation, the first intermediate results being erased from the cache memory of the processing unit;

generating at least one second image representative of a second set of results Y2 including at least one second result y2, the second set of results Y2 being generated by the application, by the processing unit, of a second processing operation based on the set of parameters X stored in the second area of the first storage unit, the first set of results Y1 and the second set of results Y2 being equal except in the event of loss of integrity of the portable electronic device; and in a second displaying step, displaying the at least one second image on the display screen for a second predetermined time period.

Such a set of parameters X may, for example, comprise at least one parameter x chosen from parameters related to the load on board the aircraft, parameters related to the flight performance of the aircraft, parameters related to the mission to be performed by the aircraft, parameters related to the weather conditions, or else parameters related to the visibility or to the flight conditions of the aircraft.

As previously indicated, such a method is configured to allow a user of the portable electronic device to detect a loss of integrity of the portable electronic device prior to its use or during its use in flight. In addition, such a loss of integrity may relate to the processing unit comprising a cache memory but also to the first storage unit formed, for example, by a read-only memory (ROM) or a random-access memory (RAM). The loss of integrity may also relate to a display screen or to an input member.

Thus, such a testing method can be implemented constantly during a flight phase of the aircraft and therefore during use of the portable electronic device. The first and second sets of results Y1, Y2 may therefore carry information useful for piloting the aircraft such as, for example, a maximum speed of movement, a maximum rate of climb, a ceiling, a maximum take-off weight, etc.

A loss of integrity of the portable electronic device may be detected visually by the user, for example, if he or she observes differences between the first images and the second images. Such differences have the effect of generating a blurred or flashing display of all or some of the images displayed on the display screen. Such a blurred display or flashing images can be detected easily by a user of the portable electronic device.

Moreover, a loss of integrity of the portable electronic device may also be detected automatically by an analysis of the differences between the first and second sets of results Y1, Y2 and/or between the first images and the second images. Such an analysis can advantageously be carried out directly by the processing unit of the portable electronic device.

According to a first embodiment of the disclosure, the method may comprise storing the first set of results Y1 in a first area of a second storage unit and storing the second set of results Y2 in a second area of the second storage unit.

In this case, the steps of generating at least one first image representative of a first set of results Y1 and of generating at least one second image representative of a second set of results Y2 can be performed once respectively. These steps of generating at least one first image and at least one second image can be carried out one after another, in succession, by the same microprocessor of the processing unit. The processing unit may alternatively comprise several microprocessors or a multi-core microprocessor, and then carry out such steps of generating at least one first image and at least one second image simultaneously.

However, the first displaying step for displaying said at least one first image and the second displaying step for displaying said at least one second image may be repeated several times alternately. Repeating the display steps in this way, according to a sequence of several loops, can thus cause the images to flash if there are differences between the first and second images.

According to a first example of the first embodiment, the first storage unit can be merged with the second storage unit and be formed by an addressable random-access memory so as to be able to retrieve the first and second sets of results Y1 and Y2.

According to a second example of the first embodiment, the first storage unit can be separate from the second storage unit. For example, the set of parameters X may be stored in a read-only memory, also referred to as a ROM, of the portable electronic device. The first and second sets of results Y1 and Y2 may, for example, be stored in an external ROM such as a removable memory card.

According to a third example of the first embodiment, the first storage unit can be partially merged with the second storage unit. For example, the first area of the first storage unit may be merged with the second area of the second storage unit. Similarly, the second area of the first storage unit may be merged with the first area of the second storage unit.

Thus, the first area of the first storage unit and the second area of the second storage unit may be formed by the ROM of the portable electronic device. The second area of the first storage unit and the first area of the second storage unit may be formed by an external ROM.

Alternatively, and according to a second embodiment of the disclosure, the method may include a second erasing step for erasing calculation steps carried out during the second processing operation, the calculation steps being erased from the cache memory of the processing unit.

In other words, in this scenario, the first set of results Y1 and the second set of results Y2 are no longer necessarily stored.

A sequence may then repeat, several times in a loop, the steps of generating the first image or images, displaying the first image or images in the first displaying step, erasing the first intermediate results in the first erasing step, generating the second image or images, displaying the second image or images in the second displaying step and erasing the second intermediate results in the second erasing step.

Furthermore, the testing method according to the disclosure may also include a first verification sub-step consisting in verifying that at least one parameter x of the set of parameters X lies within a first predetermined range of values.

Moreover, when the at least one parameter x of the set of parameters X does not lie within the first predetermined range of values, a display of that parameter x may indicate this on the display screen. For example, the display background may change color on the displayed image and validation of the parameter x is not possible.

Similarly, the testing method according to the disclosure may include a second verification sub-step consisting in verifying that the at least one first result y1 of the first set of results Y1 lies within a second predetermined range of values.

By analogy, the testing method according to the disclosure may include a third verification sub-step consisting in verifying that at least one second result y2 of the second set of results Y2 lies within a third predetermined range of values.

According to one possibility, the first processing operation and the second processing operation may be identical.

In other words, the processing unit carries out the same processing operation on one or more parameters x of the set of parameters X stored respectively in the first area of the first storage unit and in the second area of the first storage unit.

According to another alternative, the first processing operation and the second processing operation may be equivalents, the first processing operation implementing calculations carried out in a first order and the second processing operation implementing equivalent calculations carried out in a second order different from the first order.

In this case, the second processing operation is therefore different from the first processing operation but should nevertheless produce substantially the same result as the first processing operation, except in the event of failure or loss of integrity of the portable electronic device. Minor calculation differences may occur, related to the digital processing and the calculation accuracy of the processing unit. The choice of the order of calculations of the second processing operation is such that these minor differences can be eliminated by a simple rounding of the results, with a number of significant figures such that sufficient precision is retained for the end use.

For example, the first processing operation may consist in carrying out the following calculation:

$$(x+l)*m*n=y1$$

where x, l, m, n are parameters belonging to the set of parameters X and y1 is a first result belonging to the first set of results Y1.

The second processing operation, equivalent to the first processing operation, may then consist in performing the following calculation:

$$n*m*(l+x)=y2$$

where x, l, m, n are parameters belonging to the set of parameters X and y2 is a second result belonging to the second set of results Y2.

According to another embodiment of the disclosure compatible with the previous embodiments, the at least one first image may include a first background arranged as a backdrop and the first set of results Y1 overlaid on the first background, and the at least one second image may include a second background arranged as a backdrop and the second set of results Y2 overlaid on the second background.

In addition, the first background and the second background may occupy all or part of the at least one first and at least one second image. Moreover, when the first background occupies only a first part of the at least one first image and the second background occupies only a second part of the at least one second image, these first and second parts may be of the same dimensions and be formed by the same number of pixels of the display screen.

Moreover, the first and second parts may advantageously be arranged in the same portion of said at least one first and at least one second image. In this case, when the first and second backgrounds are identical, the differences observed by the user between the at least one first image and the at least one second image can consist of the first result and the second result flashing.

Furthermore, according to another embodiment of the disclosure compatible with the previous embodiments, since the first background can be displayed for the first predetermined time period, the at least one first result can be displayed with a first delay for a first duration shorter than the first predetermined time period.

In this case, displaying the at least one first image makes it possible to produce a dynamic display of the at least one first result. Such a dynamic display of the at least one first result makes it possible for the user to visually detect if the at least one first image is frozen on the display screen of the portable electronic device.

According to another aspect compatible with the preceding aspects, the first predetermined time period may be equal to the second predetermined time period.

Thus, the at least one first image and the at least one second image are displayed for the same predetermined time period. Such a predetermined time period may be between 0.5 seconds and 5 seconds, for example.

According to one possibility compatible with the preceding possibilities, the method may comprise the following steps:

generating a third set of results Y3 comprising at least one third result y3 by application, by the processing unit, of a third processing operation based on a test set of parameters X3 comprising at least one previously stored test parameter x3;

comparing the third set of results Y3 with a previously stored set of expected results Z3; and detecting a loss of integrity of the portable electronic device when a difference between the third set of results Y3 and the set of expected results Z3 is different from zero, to within the accuracy of the calculation.

In other words, the processing unit can calculate the third set of results Y3 corresponding to a known scenario, then compare it with the set of expected results Z3, before proceeding to launch a new sequence of calculations requested by the user of the portable electronic device.

Comparing the third set of results Y3 with a set of expected results Z3 in this way makes it possible to verify the calculation capabilities of the processing unit.

Furthermore, the test set of parameters X3 and the set of expected results Z3 are advantageously stored in the first storage unit or in the second storage unit.

Alternatively, or additionally, the method may comprise the following steps:

generating a fourth set of results Y4 comprising at least one fourth result y4 by application, by the processing unit, of a fourth processing operation based on another test set X4 comprising at least one other randomly generated test parameter x4, the fourth processing operation being different from the first processing operation and the second processing operation;

comparing the fourth set of results Y4 with another stored set of expected results Z4; and detecting a loss of integrity of the portable electronic device when a difference between the fourth set of results Y4 and the other set of expected results Z4 is different from zero.

This method advantageously makes it possible to force the processing unit to recalculate, without being able use intermediate or end results previously stored in cache memory.

Furthermore, the other test set of parameters X4 and the other set of expected results Z4 are advantageously stored in the first storage unit or optionally in the second storage unit.

For example, this other test set of parameters X4 may comprise at least one other test parameter x4 in the form of a number chosen randomly between 0 and 1, and the step of generating the fourth set of results Y4 may consist in applying simple mathematical operations to this number, such as additions, subtractions, multiplications, divisions or more complex operations.

Other calculations can also apply, to the randomly chosen number, mathematical functions such as, for example, absolute value functions, power functions, root functions, exponential functions, logarithmic functions or indeed trigonometric functions such as, for example, sine, cosine or tangent, or derivative and integral functions.

Finally, this step of generating the fourth set of results Y4 can implement logical operators such as the equals sign "=", the logical operator AND denoted by the sign "&&" in the C++ programming language or the logical operator OR denoted by the sign "II" in the C++ programming language.

According to one particular embodiment, the step of generating the fourth set of results Y4 may consist in performing operations of the following type:

$$\frac{\sqrt{\left(x4 + \left(1 - \left((\sin x4)^2 + \frac{1 + \cos(2 * x4)}{2}\right)\right)\right) * x4}}{x4} = y4$$

The fourth result y4 is then compared with the other expected result z4 for this operation, which is equal to 1.

If this fourth result y4 is different from 1, to within the accuracy of the calculation, all the outputs of the processing unit are rendered invalid and the data on the display screen is erased and, optionally, an alert message can be displayed to indicate that the portable electronic device has lost its integrity and should therefore no longer be used by its user.

Optionally, a complete test of the entire portable electronic device may be initiated in parallel with the displaying of the alert message.

Moreover, the testing method according to the disclosure may also include an additional verification step consisting in verifying that the at least one test parameter x4 lies within another predetermined range of values.

In practice, the method may comprise the following steps:
displaying at least one stored reference image, the at least one reference image allowing all the pixels constituting the display screen to be activated; and
detecting a display defect in at least one pixel of the display screen.

Such a sequence of steps of the testing method therefore allows a user of the portable electronic device to visually detect, for example, one or more pixels no longer operating on the display screen.

In addition, such a detection of pixels referred to as "dead" pixels may also be performed partially automatically by analyzing the display of the reference image or images. For example, such an analysis may be carried out directly by the processing unit of the portable electronic device.

In addition, the reference image or images are advantageously stored in the first storage unit or optionally in the second storage unit.

Advantageously, the step of displaying the at least one reference image and the step of detecting a display defect may be performed prior to the step of acquiring the set of parameters X.

These steps of displaying the at least one reference image and of detecting a display defect may therefore, for example, constitute steps of initializing the testing method.

Moreover, the method may include a step of transmitting a control order from the acquisition member to the processing unit, this control order carrying a request for the step of displaying the at least one reference image.

In this case, the steps of displaying the at least one reference image and of detecting a display defect can also be carried out at any time at the request of the user of the portable electronic device.

In practice, the acquisition step can comprise inputting at least one parameter x of the set of parameters X with a manual input device of the acquisition member, the manual input device being selected from the group comprising control buttons, keyboards, thumbwheels, designators, mice and touch panels.

The user can thus manually actuate the acquisition member in order to generate the control order that can then be transmitted to the processing unit.

In addition, once the set of parameters X has been input by the user or, alternatively, each time a parameter x of the set of parameters X is input, the parameter or parameters x may be displayed on the display screen of the portable electronic device in order for the user to be able to ensure that the stored parameters X are indeed those that have been input by the user. If the user detects an error in the display of the parameters X, the user can then actuate a control for generating a control order in order to initiate a step of initializing the testing method and/or the user can possibly choose not to use the portable electronic device whose loss of integrity has been identified. The user can thus choose to use another portable electronic device. Indeed, an aircraft may advantageously carry at least two portable electronic devices on board.

According to another alternative or additional embodiment, the acquisition step may comprise receiving an electromagnetic signal carrying the at least one parameter x of the set of parameters X, the acquisition member comprising a wireless communication card capable of receiving the electromagnetic signal via a wireless communication protocol.

For example, such a wireless communication protocol may be chosen from mobile phone protocols, protocols known as Wi-Fi or Bluetooth.

In this case, the method for testing the portable electronic device may automatically be triggered remotely by an avionics system of the aircraft or by a ground station with which the portable electronic device is capable of communicating via a wireless link.

Advantageously, the first erasing step may comprise a plurality of calculations generating a plurality of results stored in the cache memory of the processing unit in order to force the replacement of the intermediate results of the cache memory of the processing unit.

This plurality of calculations thus makes it possible to perform a context switch and, in other words, a purge of the cache memory of the processing unit.

In this way, the first erasing steps and the possible second erasing steps can be carried out in a simply manner, without needing to address the data stored in the cache memory of the processing unit.

BRIEF DESCRIPTION OF THE DRAWINGS

The disclosure and its advantages appear in greater detail in the context of the following description of embodiments given by way of illustration and with reference to the accompanying figures, in which.

DETAILED DESCRIPTION

Elements that are present in more than one of the figures are given the same references in each of them.

Figure 1:
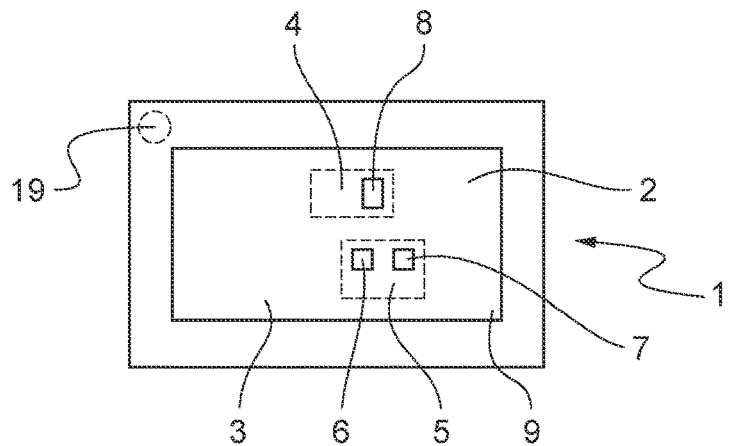
FIG. 1 is a front view of a portable electronic device intended for use on board an aircraft.

As shown in FIG. 1, a portable electronic device 1 may be in the form of a tablet computer, a telephone such as a smartphone, or a computer. The portable electronic device 1 thus includes an acquisition member 2 including, for example, a manual input device 9.

Such a manual input device 9 may, in particular, comprise buttons, a keyboard, a thumbwheel or a touch panel allowing a user to manually input and acquire data or values of parameters.

Alternatively, or additionally, the acquisition member may comprise a wireless communication card 19 capable of receiving an electromagnetic signal via a wireless communication protocol.

In addition, the portable electronic device 1 has a processing unit 4, a first storage unit 5 and a display screen 3.

The processing unit 4 may, for example, comprise at least one processor and at least one memory, at least one integrated circuit, at least one programmable system, or at least one logic circuit, these examples not limiting the scope given to the expression "processing unit". The term "processor" may refer equally to a central processing unit (CPU), a graphics processing unit (GPU), a digital signal processor (DSP), a microcontroller, a "System on Chip" system (SoC) grouping together several of these functions, etc. Such a processing unit 4 further comprises an internal cache memory 8.

Moreover, the first storage unit 5, which may be separate from the processing unit 4 or grouped together with this processing unit 4 on the same integrated circuit, comprises a first storage area 6 and a second storage area 7, the second area 7 being separate from the first area 6. In other words, the address of the first area 6 is different, and possibly adjacent, to the address of the second area 7.

Figure 2:
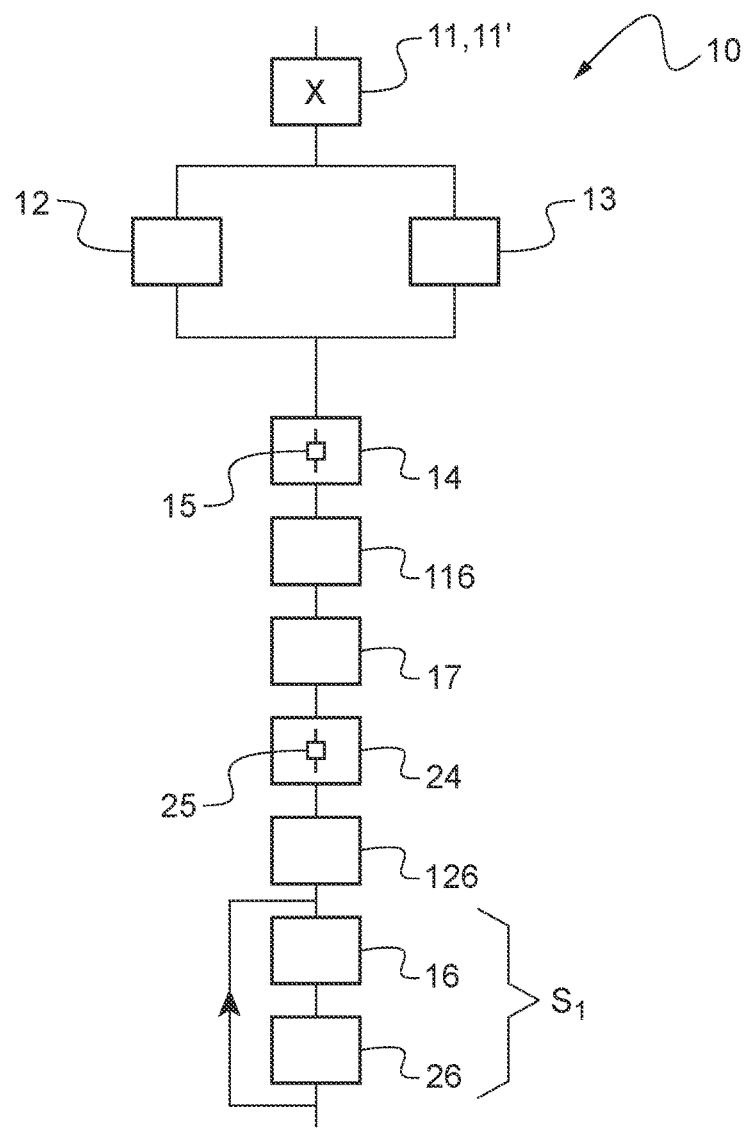
FIG. 2 is a first logic diagram showing a first embodiment of a method for testing a portable electronic device according to the disclosure.

As shown in FIG. 2, a first embodiment of a method for testing a portable electronic device 1 includes a sequence of several steps.

Thus, the method 10 includes a step 11, 11' of acquiring a value of at least one parameter x constituting a set of parameters X via the acquisition member 2 of the portable electronic device 1.

In practice, the step 11 of acquiring the set of parameters X can be performed manually by a user of the portable electronic device 1 when the acquisition member 2 comprises a manual input device 9.

Alternatively, or additionally, the step 11' of acquiring the set of parameters X can be carried out by receiving an electromagnetic signal when the acquisition member 2 comprises a wireless communication card 19 for receiving the electromagnetic signal via a wireless communication protocol.

Figure 3:
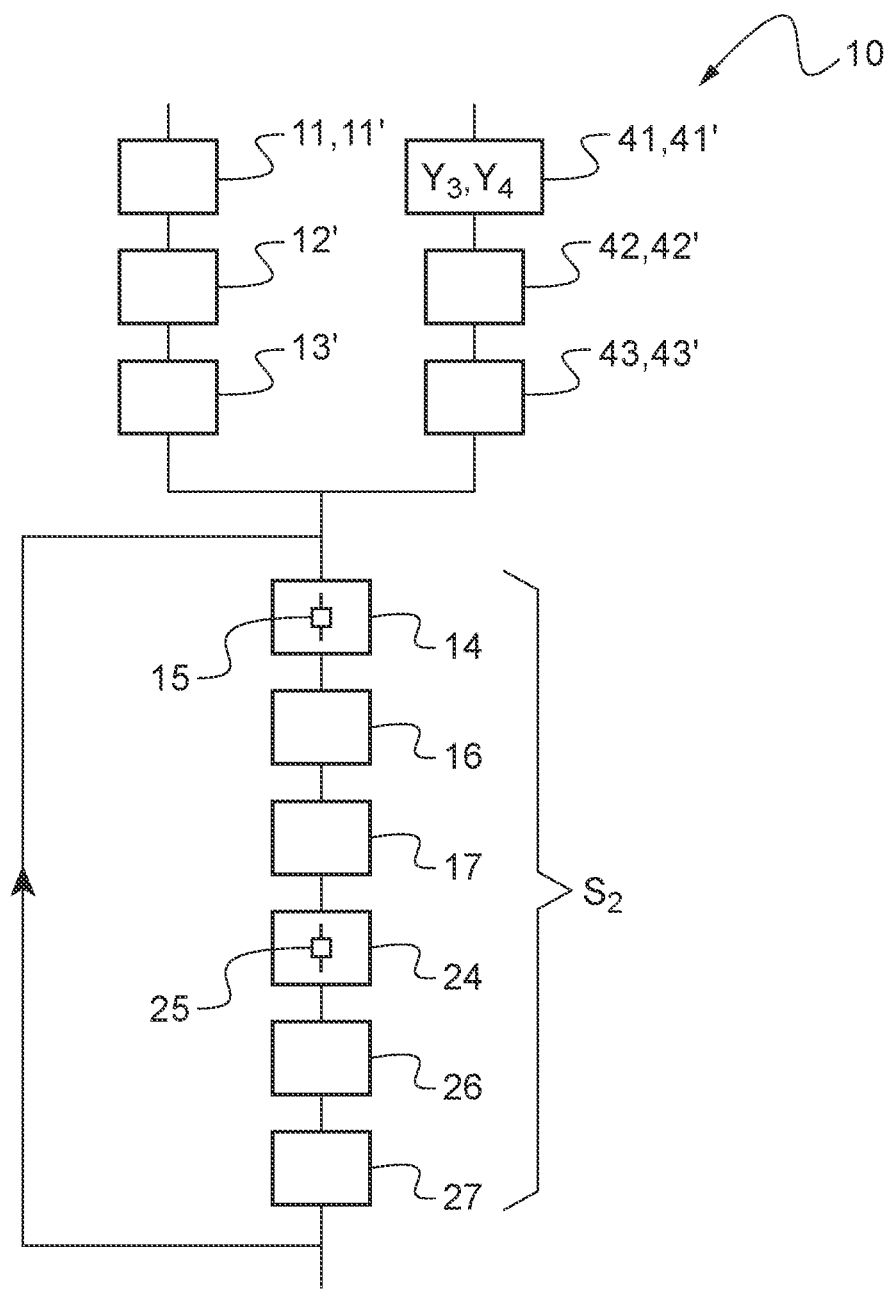
FIG. 3 is a second logic diagram showing a second embodiment of a method for testing a portable electronic device according to the disclosure.

The method 10 then includes a step 12 of storing the set of parameters X in the first area 6 of the first storage unit 5 and, for example in parallel, or simultaneously, a step 13 of storing the same set of parameters X in the second area 7 of the first storage unit 5. According to another embodiment of the method 10 as shown in FIG. 3, the storing step 12' and the storing step 13' may also be implemented successively, one after another. However, regardless of the embodiment of the testing method, the two storing steps can be implemented one after another or simultaneously.

Advantageously, the parameter or parameters x stored in at least one of the areas 6 and 7 of the first storage unit can be displayed on the display screen 3, allowing the user to ensure that what is stored matches what has been input on the manual input device 9.

Regardless of the embodiment and the manner used to define the value of the parameter or parameters x of the set of parameters X, the method 10 may comprise a sequence S1, S2 of several loops consisting in repeating several steps in succession.

The method 10 then comprises a step 14 of generating at least one first image representative of at least one first set of results Y1 including at least one first result y1, the first set of results Y1 being generated by the application, by the processing unit 4, of a first processing operation based on at least one parameter x of the set of parameters X stored in the first area 6 of the first storage unit 5. This step 14 of generating at least one first image may optionally comprise a first sub-step 15 of duplicating the parameter or parameters x of the set of parameters X and possibly the intermediate results in the cache memory 8 of the processing unit 4.

The method 10 then comprises storing 116 the first set of results Y1 in a first area of a second storage unit that may optionally be completely or partially merged with the first storage unit 5.

The method 10 then includes a step 17 of erasing first intermediate results corresponding to calculation steps carried out during the first processing operation. Thus, such an erasing step 17 makes it possible to perform a context switch of the cache memory 8 of the processing unit 4.

In practice, this first erasing step 17 may be carried out by means of a plurality of calculations generating a plurality of results stored in the cache memory 8 of the processing unit 4 in order to replace the set of parameters X and, possibly, the intermediate results.

The method 10 then comprises a step 24 of generating at least one second image representative of at least one second set of results Y2 comprising at least one second result y2, the second set of results Y2 being generated by the application, by the processing unit 4, of a second processing operation based on at least one parameter x of the set of parameters X stored in the second area 7 of the storage unit 5. Furthermore, the first processing operation and the second processing operation are also configured to obtain the first set of results Y1 equal to the second set of results Y2.

This step 24 of generating at least one second image may comprise a second sub-step 25 of duplicating the set of parameters X in the cache memory 8 of the processing unit 4.

The method 10 then comprises a step 126 of storing the second set of results Y2 in a second area of the second storage unit.

The method 10 then comprises a sequence S1 consisting in repeating, several times in a loop, a first displaying step for displaying the at least one first image on the display screen 3 for a first predetermined time period, then a second displaying step 26 for displaying the at least one second image on the display screen 3 for a second predetermined time period.

At the end of this predetermined time period, the image or images generated in the generation step 14 are substituted for the image or images generated in the generation step 24.

According to this first example of the method 10, the first and second images are therefore displayed in alternation by storing and successively displaying the results obtained in the image generation steps 14 and 24, without repeating the preceding steps.

Alternatively, according to a second example of the method 10 shown in FIG. 3, the method may include a second erasing step 27 for erasing calculation steps carried out during the second processing operation, the calculation steps being erased from the cache memory 8 of the processing unit 4.

Optionally, all or some of the parameters x and the intermediate results can be erased from the cache memory 8 of the processing unit 4. In this case, the calculations may be repeated in the step 14 of generating at least one first image.

The method 10 then comprises another sequence S2 consisting in repeating, several times in a loop, the generation of at least one first image, the displaying 16 of the at least one first image in the first displaying step, the erasing 17 of first intermediate results in the first erasing step, the generation 24 of at least one second image, the displaying 26 of the at least one second image in the second displaying step, and the erasing 27 of calculation steps in the second erasing step.

As previously, the image generated in the generation step 24 is substituted for the image generated in the generation step 14.

In practice, each first erasing step 17 and each second erasing step 27 carried out during the sequence S2 may be carried out respectively by means of a plurality of calculations generating a plurality of results stored in the cache memory 8 of the processing unit 4 in order to replace the set of parameters X and, possibly, the intermediate results.

This testing method 10 therefore enables a user of the portable electronic device 1 to detect a loss of integrity of the portable electronic device 1 prior to its use or during its use during a flight phase of the aircraft.

For example, the first processing operation and the second processing operation may be identical or else different but equivalents, i.e., the first processing operation and the second processing operation are configured to obtain the first set of results Y1 and the second set of results Y2 that are equal to each other. In this second scenario, the first processing operation may implement calculations carried out in a first order and the second processing operation may implement equivalent calculations carried out in a second order different from the first order.

Consequently, except in the event of loss of integrity of the portable electronic device 1, the first and second sets of results Y1 and Y2 are equal and, consequently, the first and second images must be identical to each other.

Therefore, a loss of integrity of the portable electronic device 1 may be detected visually by the user, for example, if he or she observes differences between the first images and the corresponding second images. Such differences can have the effect of generating a flashing display of the images on the display screen 3. Such flashing images can be detected easily by a pilot or any member of the crew of the aircraft.

Moreover, a loss of integrity of the portable electronic device 1 may also be detected partially automatically by an analysis of the differences between the first images and the second images. Such an analysis can advantageously be carried out directly by the processing unit 4 of the portable electronic device 1.

For example, the at least one first image may include a first background arranged as a backdrop and the first set of results Y1 overlaid on the first background. Similarly, the at least one second image may include a second background arranged as a backdrop and the second set of results Y2 overlaid on the second background.

Moreover, when this first background is displayed for the first predetermined time period, the first set of results Y1 can be displayed with a first delay for a first duration shorter than the first predetermined time period.

This first delay makes it possible, in particular when switching from an input screen to a results screen comprising the at least one first image, and vice versa when switching from the results screen to the input screen, to produce a dynamic display of the first set of results Y1. Such a dynamic display of the at least one first image thus allows the user to visually detect if the display screen 3 of the portable electronic device 1 is frozen.

As shown in FIG. 3, prior to the sequence S2, a second embodiment of a method 10 for testing a portable electronic device 1 may comprise a sequence of several additional steps carried out, for example, in parallel with the steps 11, 11' of acquiring the set of parameters X, of storing 12' the set of parameters X in the first area 6, and of storing 13' the set of parameters X in the second area 7.

Therefore, such a sequence of additional steps may comprise a step 41, 41' of generating third and fourth sets of results Y3 and Y4 by application, by the processing unit 4, of third and fourth processing operations based on at least one test parameter x3 and one other test parameter x4. In addition, such third and fourth processing operations are different from the first processing operation and the second processing operation.

This sequence of additional steps then comprises a step 42, 42' of comparing the third and fourth sets of results Y3 and Y4 with sets of expected results Z3 and Z4 stored, for example, in the first storage unit 5.

Finally, a step 43, 43' of detecting a loss of integrity of the portable electronic device 1 may be implemented when the difference between the third or fourth result y3, y4 and the expected result of the step is different from zero.

Figure 4:
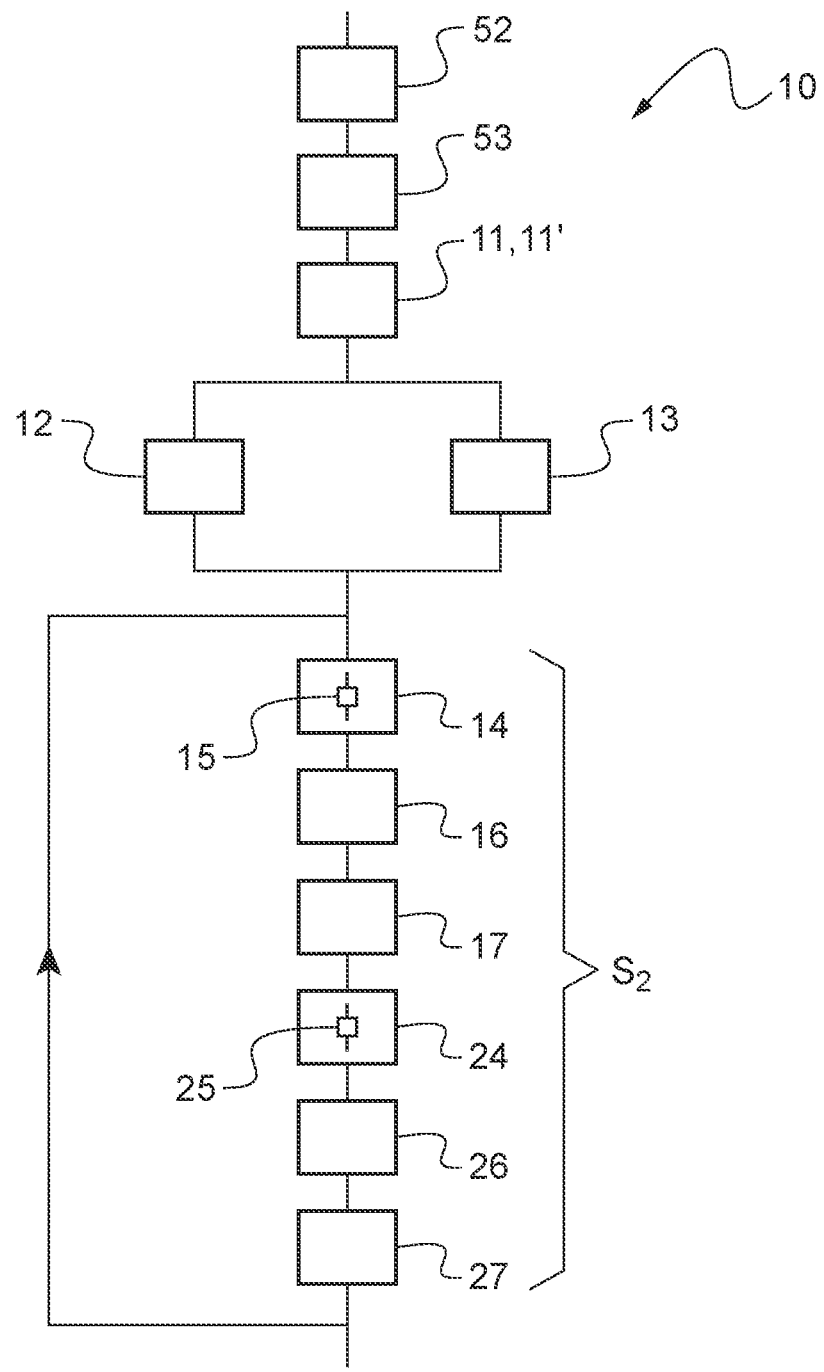
FIG. 4 is a third logic diagram showing a third embodiment of a method for testing a portable electronic device according to the disclosure.

In a manner compatible with the other variants, as shown in FIG. 4, a third embodiment of a method 10 for testing a portable electronic device 1 may include other additional steps added to the steps of the first embodiment of the testing method 10 shown in FIG. 2.

These other additional steps thus comprise a step 52 of displaying at least one reference image stored in the first storage unit 5, this reference image allowing all the pixels constituting the display screen 3 to be activated.

These other additional steps then also include a step 53 of detecting a display defect in at least one pixel of the display screen 3.

As shown, such a step 52 of displaying the at least one reference image and such a step 53 of detecting a display defect may advantageously be performed prior to the step 11, 11' of acquiring at least one parameter x of the set of parameters X.

Furthermore, the step 52 of displaying the at least one reference image and the step 53 of detecting a display defect may, for example, be carried out by supplying a control order to the processing unit 4 via the acquisition member 2.

Naturally, the present disclosure is subject to numerous variations as regards its implementation. Although several embodiments are described above, it should readily be understood that it is not conceivable to identify exhaustively all the possible embodiments. It is naturally possible to envisage replacing any of the means described by equivalent means without going beyond the ambit of the present disclosure.

What is claimed is:

1. A method for testing a portable electronic device, the portable electronic device including an acquisition member, a processing unit including a cache memory, a first storage unit and a display screen,
    wherein the method comprises the following steps:
    acquiring a set of parameters including at least one parameter via the acquisition member;
    storing the set of parameters in a first area of the first storage unit;
    storing the set of parameters in a second area of the first storage unit, the second area being separate from the first area;
    generating at least one first image representative of a first set of results including at least one first result, the first set of results being generated by the application, by the processing unit, of a first processing operation based on the set of parameters stored in the first area of the first storage unit;
    in a first displaying step, displaying the at least one first image on the display screen for a first predetermined time period;
    in a first erasing step, erasing first intermediate results corresponding to calculation steps carried out during the first processing operation, the first intermediate results being erased from the cache memory of the processing unit;
    generating at least one second image representative of a second set of results including at least one second result, the second set of results being generated by the application, by the processing unit, of a second processing operation based on the set of parameters stored in the second area of the first storage unit, the first set of results and the second set of results being equal except in the event of loss of integrity of the portable electronic device; and
    in a second displaying step, displaying the at least one second image on the display screen for a second predetermined time period.

2. The method according to claim 1,
    wherein the method comprises storing the first set of results in a first area of a second storage unit and storing the second set of results in a second area of the second storage unit.

3. The method according to claim 1,
    wherein the method includes a second erasing step for erasing calculation steps carried out during the second processing operation, the calculation steps being erased from the cache memory of the processing unit.

4. The method according to claim 1,
    wherein the first processing operation and the second processing operation are identical.

5. The method according to claim 1,
    wherein the first processing operation and the second processing operation are equivalents, the first processing operation implementing calculations carried out in a first order and the second processing operation implementing equivalent calculations carried out in a second order different from the first order.

6. The method according to claim 1,
    wherein the at least one first image includes a first background arranged as a backdrop and the first set of results overlaid on the first background, and the at least one second image includes a second background arranged as a backdrop and the second set of results overlaid on the second background.

7. The method according to claim 1,
    wherein the first predetermined time period is equal to the second predetermined time period.

8. The method according to claim 1,
    wherein the method comprises the following steps:
    generating a third set of results comprising at least one third result by application, by the processing unit, of a third processing operation based on a test set of parameters comprising at least one previously stored test parameter;
    comparing the third set of results with a previously stored set of expected results; and
    detecting a loss of integrity of the portable electronic device when a difference between the third set of results and the set of expected results is different from zero.

9. The method according to claim 1,
    wherein the method comprises the following steps:
    generating a fourth set of results comprising at least one fourth result by application, by the processing unit, of a fourth processing operation based on another test set comprising at least one other randomly generated test parameter, the fourth processing operation being different from the first processing operation and the second processing operation;
    comparing the fourth set of results with another stored set of expected results; and
    detecting a loss of integrity of the portable electronic device when a difference between the fourth set of results and the other set of expected results is different from zero.

10. The method according to claim 1,
    wherein the method comprises the following steps:
    displaying at least one stored reference image, the at least one reference image allowing all the pixels constituting the display screen to be activated; and
    detecting a display defect in at least one pixel of the display screen.

11. The method according to claim 10,
wherein the step of displaying the at least one reference image and the step of detecting a display defect are performed prior to the step of acquiring the set of parameters.

12. The method according to claim 10,
wherein the method includes a step Of transmitting a control order from the acquisition member to the processing unit, the control order carrying a request for the step of displaying the at least one reference image.

13. The method according to claim 1,
wherein the acquisition step includes inputting the set of parameters with a manual input device of the acquisition member, the manual input device being selected from the group comprising control buttons, keyboards, designators, mice, thumbwheels and touch panels.

14. The method according to claim 1,
wherein the acquisition step comprises receiving an electromagnetic signal carrying the set of parameters, the acquisition member comprising a wireless communication card capable of receiving the electromagnetic signal via a wireless communication protocol.

15. The method according to claim 1,
wherein the first erasing step comprises a plurality of calculations generating a plurality of results stored in the cache memory of the processing unit in order to force the replacement of the intermediate results of the cache memory of the processing unit.

* * * * *